(12) United States Patent
Yao et al.

(10) Patent No.: US 6,373,064 B1
(45) Date of Patent: Apr. 16, 2002

(54) SEMICONDUCTOR RADIATION SPECTROMETER

(75) Inventors: H. Walter Yao, Lincoln, NE (US); Ralph B. James, Livermore, CA (US)

(73) Assignee: Sandia Corporation, Livermore, CA (US)

(*) Notice: Subject to any disclaimer, the term of this patent is extended or adjusted under 35 U.S.C. 154(b) by 0 days.

(21) Appl. No.: 09/233,364

(22) Filed: Jan. 19, 1999

Related U.S. Application Data

(60) Provisional application No. 60/102,827, filed on Oct. 2, 1998.

(51) Int. Cl.[7] ................................................. G01T 1/24
(52) U.S. Cl. ................................................. 250/370.13
(58) Field of Search ....................... 250/370.13; 257/108, 257/470, 441, 451

(56) References Cited

U.S. PATENT DOCUMENTS 4,482,807 A * 11/1984 Blackburn et al. ..... 250/370.13
5,677,539 A * 10/1997 Apotovsky et al. .... 250/370.13

OTHER PUBLICATIONS

Antonis et al., Infra-red Microscopy of Cd(Zn) Te Radiation Detectors Revealing Their Internal Electric Field Structure Under Bias, IEEE Transactions on Nuclear Science, vol. 43, No. 3, Jun. 1996, pp. 1487–1490.*

* cited by examiner

*Primary Examiner*—F. L. Evans
*Assistant Examiner*—Zandra V. Smith
(74) *Attorney, Agent, or Firm*—L. E. Carnahan; T. P. Evans

(57) ABSTRACT

An improved semiconductor radiation detector which involves engineering the internal electrical field through an external infrared light source. A planar semiconductor radiation detector is applied with a bias voltage, and an optical light beam with a selected photon energy is used to illuminate the detector and engineer the internal electric field. Different light beam intensities or photon energies produce different distributions of the internal electric field. The width of the electric field can be fine-tuned by changing the optical beam intensity and wavelength, so that the radiation detector performance can be optimized. The detector is portable, small in size, and operates at room temperature.

23 Claims, 4 Drawing Sheets

SEMICONDUCTOR RADIATION SPECTROMETER

RELATED APPLICATION

This application relates to the U.S. Provisional Application No. 60/102,827 filed Oct. 2, 1998, and claims priority thereof.

GOVERNMENT RIGHTS

The United States Government has rights in this invention pursuant to Contract No. ACO4-94AL85000 with Sandia National Laboratories.

BACKGROUND OF THE INVENTION

The present invention is directed to semiconductor radiation detectors, particularly to an improved semiconductor radiation spectrometer, and more particularly to a field engineered radiation spectrometer, based on engineering of the internal electrical field distribution via illumination by an optical light beam with a selected photon energy.

Semiconductor radiation detectors are utilized in a wide range of applications, such as medical imaging, environmental monitoring, baggage handling, materials sorting, nuclear materials detection, etc. The internal electric field distribution is an important key factor for the performance of semiconductor radiation detectors. Radiation detector researchers and manufacturers have made great effort to redesign or modify hardware for better detector performances, such as improved energy resolutions, sensitivities and signal to noise ratios. The hardware improvements, in essence, have been mainly aimed to redistribute the internal electric field distribution in a radiation detector to accomplish higher photo peak resolution and efficiency. Those detectors are generally known as single-charge collection devices, such as the coplanar electrodes, and the three-electrode detectors, etc. For such coplanar electrode detectors, see P.N. Luke, IEEE Trans. Nucl. Sci. 42,207 (1995), "Unipolar Charge Sensing With Coplanar Electrodes-Application To Semiconductor Detectors;" and for the three-electrode detectors, see C.L. Lingren et al., IEEE Trans. Nucl. Sci. (1998), "Cadmiun-Zinc-Telluride, Multiple-Electrode Detectors Achieve Good Energy Resolution With High Sensitivity At Room Temperature." While these coplanar and three electrode device structures have improved the detector sensitivity, these structures are usually complex, difficult and expensive to manufacture. Thus, there is a need for a sensitive, less expensive semiconductor radiation detector.

The present invention provides a solution to the above-mentioned need by providing an improved semiconductor radiation detector which involves engineering the internal electric field through an internal infrared light source. The invention is field engineered radiation spectrometer (FERADS), which uses an optical beam with a selected photon energy to illuminate the detector and engineer the internal electric field. Tests have shown that different light beam intensities or photon energies produce different distributions of the internal electric field, thus radiation detector performance can be optimized.

SUMMARY OF THE INVENTION

It is an object of the present invention to provide an improved semiconductor radiation detector.

A further object of the invention is to provide a field engineered radiation spectrometer.

A further object of the invention is to provide a method for improving semiconductor radiation detectors by engineering the internal electrical field through an external infrared light source.

Another object of the invention is to provide a method for improving semiconductor radiation detectors by illuminating the detector with an optical light beam with a selected photon energy.

Another object of the invention is to provide a method for engineering the internal electric field of a semiconductor radiation detector by controlling light beam intensities or photon energies of an optical light beam which illuminates the detector.

Other objects and advantages of the present invention will become apparent from the following description and accompanying drawings. Basically, the invention is a field engineered radiation spectrometer, and more particularly the invention involves improved semiconductor radiation detectors obtained by engineering the internal electrical field through an external infrared light source. By applying a bias voltage across a planar semiconductor radiation detector and illuminating the detector with an optical light beam with a selected photon energy, the internal electric field can be engineered. Tests have shown that different light beam intensities or photon energies produce different distributions of the internal electric field. By the method of this invention, the width of the electric field can be fine-tuned by changing the optical beam intensity and wavelength, so that the radiation detector performance can be optimized. The improved semiconductor radiation detector is portable, small size, and operates at room temperature. This invention enables stacking of many smaller detectors, vertically and horizontally, to further increase the overall detector efficiency. The optical method of this invention provides a simple, nondestructive, contactless, and less costly approach to produce improved semiconductor radiation detectors.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to an improved semiconductor radiation spectrometer based on engineering of the internal electrical field distribution. The invention involves a field engineered radiation spectrometer (FERADS). According to the present invention, improved semiconductor radiation detectors are obtained by a method involving engineering the internal electrical field through an external light source, where the photon energy of the light source is near (±0.2 eV) the semiconductor band gap. The external light source may be infrared. The method involves applying a bias voltage across a planar semiconductor radiation detector (i.e., a $Cd_{1-x}Zn_xTe$ where the Zn composition is between 0–0.4, and referred to hereinafter as CdZnTe detector) and illuminating the detector with an optical light beam with a selected photon energy to engineer the internal electric field. The planar detector may be composed of a single pixellated, or strip electrode. Different light beam intensities or photon energies produce different distributions of the internal electric field. The width of the electric field can be fine-tuned by changing the optical beam intensity and wavelength, so that the radiation detector performance can be optimized. Compared with the prior known complex, destructive and expensive hardware modifications used to engineer the electric field distribution, the optical method of the present invention provides a single, contactless, and less costly approach to produce improved semiconductor radiation detectors.

Figure 1:
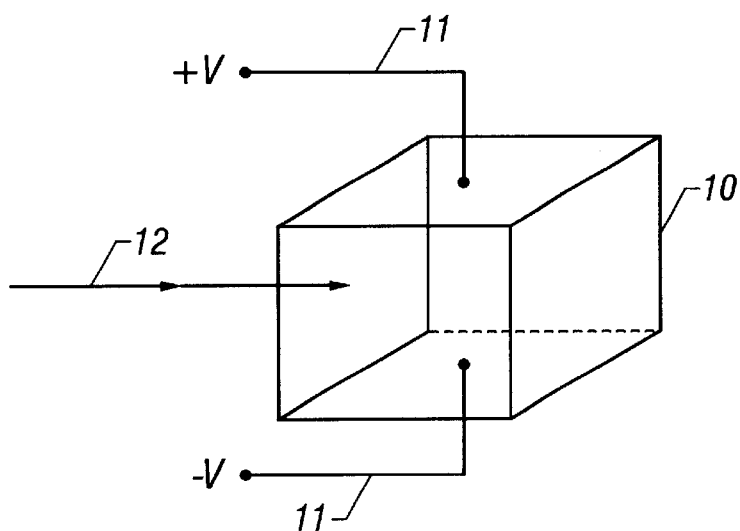
FIG. 1, schematically illustrates the method of the present invention which involves illuminate light engineering the electrical field of a semiconductor radiation detector.

Referring now to the drawings, FIG. 1 schematically illustrates the method of the present invention . A planar semiconductor radiation detector 10 is applied with a bias volt age V, i indicated at 11, and an optical light beam 12 with a selected photon energy illuminates the detector 10 and functions to engineer the internal electric field of the detector. Tests to experimentally verify the method of the invention show that light beam intensities or photon energies produce different distributions of the internal electric field, as shown in FIGS. 2A–2D.

Figure 2A:
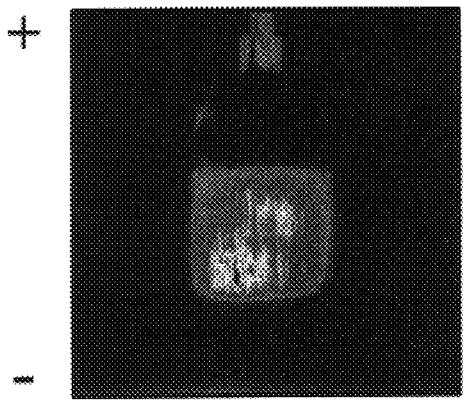
FIGS. 2A, 2B, 2C and 2D illustrate two-dimensional (2D) images of the internal-electric-field distributions inside a planar cadmium-zinc-telluride (CdZnTe) radiation detector under different conditions of an optical illuminating light.
Figure 2B:
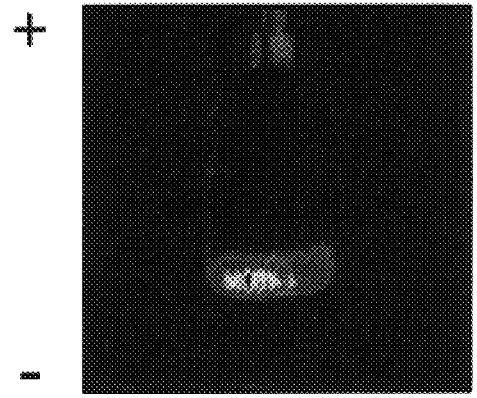
Figure 2C:
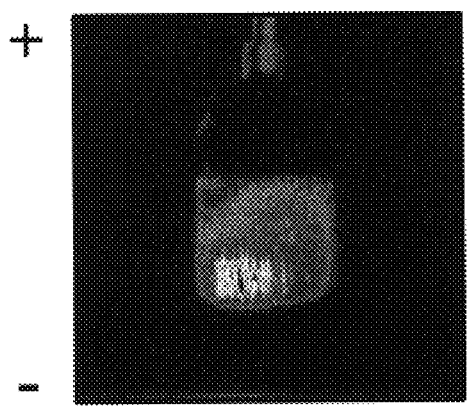
Figure 2D:
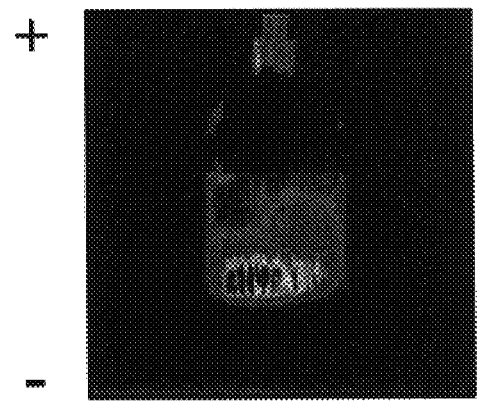

FIGS. 2A–2D show two-dimensional (2D) images of the internal-electric-field distributions inside a planar CdZnTe radiation detector at the bias of 1000 Volts under four different conditions of the optical illuminating light. FIG. 2A: without the optical illumination, a uniform electrical field distribution is observed crossing the entire thickness of the detector. FIG. 2B: illuminated by a light beam $I_o$ having a photon energy of 1.5 eV. The observed electric field is compressed into a narrow strip of ~⅓ of the detector thickness, with the voltage displacement compressed to the cathode side. FIG. 2C: with the same illuminating light as in FIG. 2B but reduced beam intensity to 0.05 $I_o$. Here, the field is compressed into a wider area of ~½ of the detector thickness. FIG. 2D: illuminated by a light beam $I_o$ having a photon energy of 1.7 eV. In this case the field observed is compressed into a wider area compared to FIG. 2B. The leakage current $I_{LK}$ is for FIGS. 2A–2D is respectively 31.2 nA, 45.5 nA, 34.9 nA, and 34.9 nA. It is noticeable that the leakage current increases as the field is compressed into a narrower area. However, the bias voltage, while exemplified above as being 1000 Volts, may be 50–300 Volts per mm of the detector width, and the leakage current is ~5–7 times the detector dark current.

Figure 3:
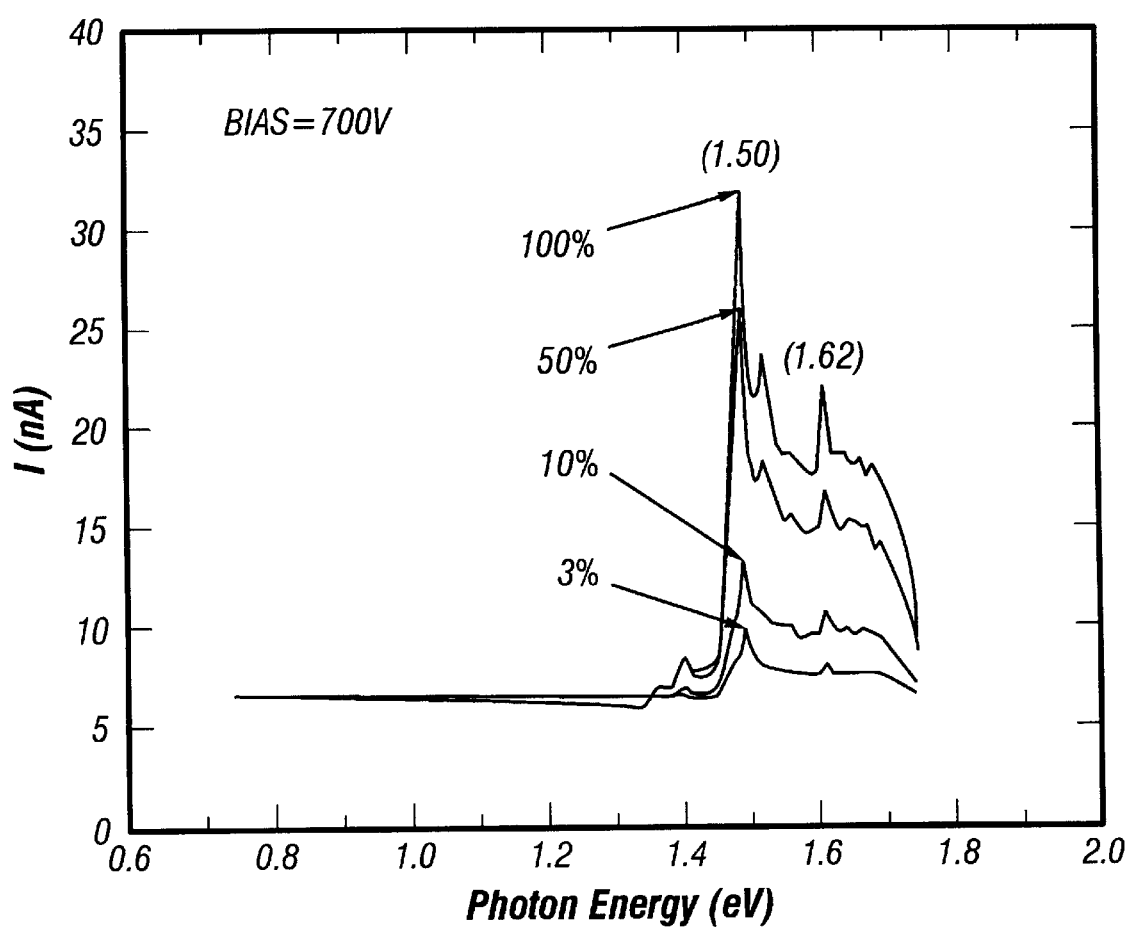
FIG. 3 graphically illustrates the photo-induced current of a CdZnTe radiation detector.

The photon-energy dependency of the photo-induced current is shown in FIG. 3, wherein a sharp peak of photo-induced current $I_{LK}$ in a CdZnTe detector is found at 1.5 eV, while the $I_{LK}$ remains unchanged below ~1.32 eV. The higher $I_{LK}$ is related with larger electric field modification. The sharp peak indicates a narrow window of photon energies which are most effective at compressing the electric field. This can be understood with our electronic energy-band-model in radiation detectors described in FIGS. 4A–4D. Therefore, by changing the intensities or photon energies of the illuminating light, we can realize the engineering of the electric field in semiconductor radiation detectors under bias. By tailoring the internal electric field, quantum jumps in the detector energy resolution and photo peak efficiency are possible. It should be noted that the photon energy is about the value of semiconductor energy band gap.

Figure 4A:
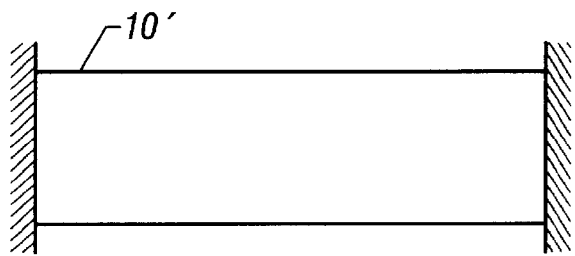
FIGS. 4A–4D illustrate an energy band model which shows the benefit of the engineered internal electrical field distribution in accordance with the present invention.
Figure 4B:
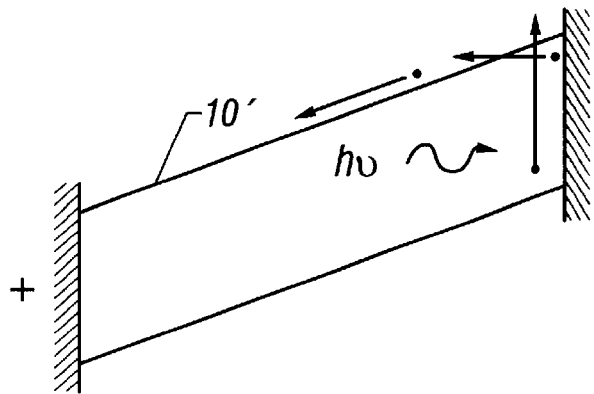
Figure 4C:
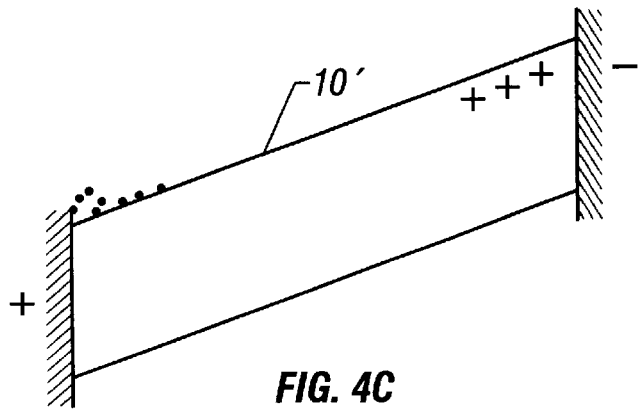
Figure 4D:
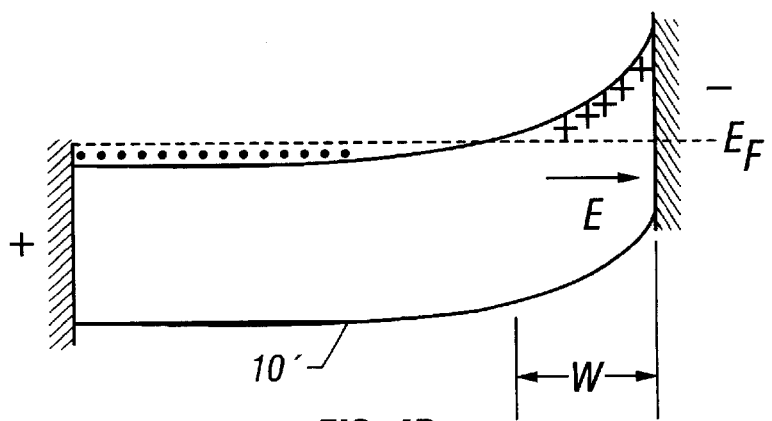

FIGS. 4A–AD show sketches of an energy band model to understand the internal electric field distribution. With no bias, the energy band should be flat, and the detector 10' is field free (see FIG. 4A). With applied bias voltage, the energy band is tilted without bending, assuming that the material is free of defects (see FIG. 4B). In this case, a uniform electric field is built across the detector. Illuminated by photons with selected energy a detector 10' will, under an applied bias, release trapped electrons from defect states, creating an ionized-ion region. The free electrons drift towards the anode (positive side) and the ionized ions form a depletion layer region on the cathode (negative side) in which the internal electric field is enhanced, as shown in FIGS. 4B, 4C and 4D. The accumulated free electrons screen the internal electric field, and flatten part of the energy band. When it reaches equilibrium, as shown in FIG. 4D, the energy band is partially bent with a built-in enhanced electric field in the band bending area (i.e., near the cathode side). This area is also known as depletion layer. Within the depletion layer, the built-in electric field is nearly uniform, while outside the bending area, the field intensity is much lower (about a factor of 10–100 smaller). This is the situation shown in FIG. 4D.

Quantitative analysis can be performed by setting up and solving the Poisson's equation, assuming a uniform background of ionized ions:

$$\frac{d^2\Phi}{dz^2} = \frac{-\rho}{\varepsilon_r\varepsilon_o} \tag{1}$$

where the z-axis is normal to the surface and points from surface into the bulk of the CdZnTe detector. Since $$\frac{d^2\Phi}{dz^2} = \frac{1}{2}\frac{d}{d\Phi}\left(\frac{d\Phi}{dz}\right)^2, \tag{2}$$

it follows that $$d\left(\frac{d\Phi}{dz}\right)^2 = \frac{-2\rho}{\varepsilon_r\varepsilon_o}d\Phi, \tag{3}$$

and, $$\frac{d\Phi(z)}{[\Phi(z)]^{1/2}} = -\left(\frac{2\rho}{\varepsilon_r\varepsilon_o}\right)^{1/2}dz. \tag{4}$$

From the boundary conditions:

$$\Phi(W) = 0 \text{ and } E(W) = -\left(\frac{d\Phi}{dz}\right)_{z=W} = 0,$$

we have $$\Phi(z) = \frac{\rho}{2\varepsilon_r\varepsilon_o}(z-W)^2. \quad (5)$$

With applied bias voltage V, we have $$\Phi(0) = \frac{\rho}{2\varepsilon_r\varepsilon_o}W^2 = V, \quad (6)$$

Therefore, $$W = \left(\frac{2\varepsilon_r\varepsilon_o\Phi(0)}{\rho}\right)^{1/2} = \left(\frac{2\varepsilon_r\varepsilon_o V}{eN_I}\right)^{1/2}, \quad (7)$$

where $p=eN_I$, and $N_I$ is the ionized-ion density.

From the calculation, we can see that the width of this depletion layer W is proportional to the square root of the bias voltage V and inversely proportional to the square root of the ionized-ion density $N_I$.

It is plausible that we can utilize this technique of electric field engineering to produce a semiconductor radiation detector with improved photo peak resolution. Currently, the main problem for semiconductor radiation detectors is the hole trapping, which provides a broad trail to the detected photo peak and thus reduces the resolution and marketability of the detectors. The hole trapping is caused by low mobility $\mu_h$ and lifetime $\tau_h$ of holes, which essentially reduce the drifting length of holes $L_h=\mu_h\tau_h E$ and cause the poor hole collection efficiency. The $\mu_h\tau_h$ product depends on the intrinsic properties of semiconductor crystals and cannot be increased without major efforts to improve the quality of crystals. An alternative way to increase the hole drifting length is to increase the electric field intensity E in the region where the holes were generated and collected. The electric field engineering technique of this invention, provides a unique way to increase the $\mu_h\tau_h E$ value as shown in FIG. 5.

Figure 5:
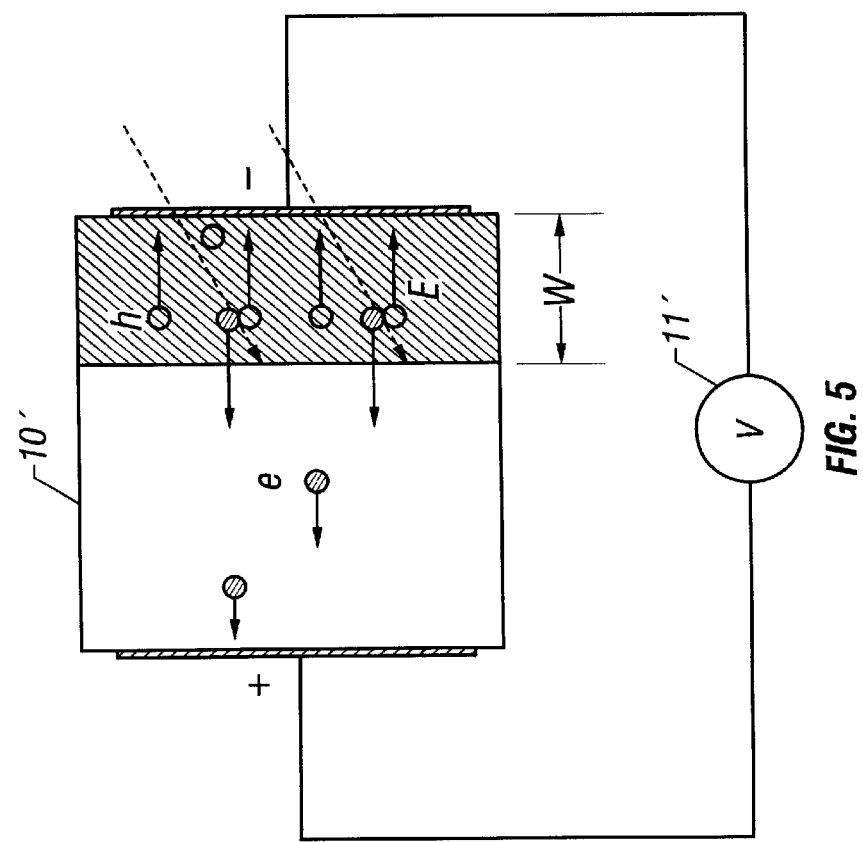
FIG. 5 shows a planar semiconductor radiation detector having an optically engineered internal electrical field distribution in accordance with the method of the present invention.

As shown in FIG. 5, the electric field in detector 10' is optically engineered to a width W narrower than the detector width. The electric field is concentrated on the cathode (negative) side. Low-energy gamma rays or X-rays incident from the cathode side generate electron-hole pairs predominantly near the cathode side. The electrons are collected at the anode (positive) side, while the holes drift towards the cathode side. Due to the increased drifting length of holes $L_h=\mu_h\tau_h E$, the hole collection efficiency increases and the hole trapping tail from the detector can be greatly reduced. The width of the electric field can be fine-tuned by changing the optical beam intensity and wavelength, so that the radiation detector performance can be optimized.

Figure 6:
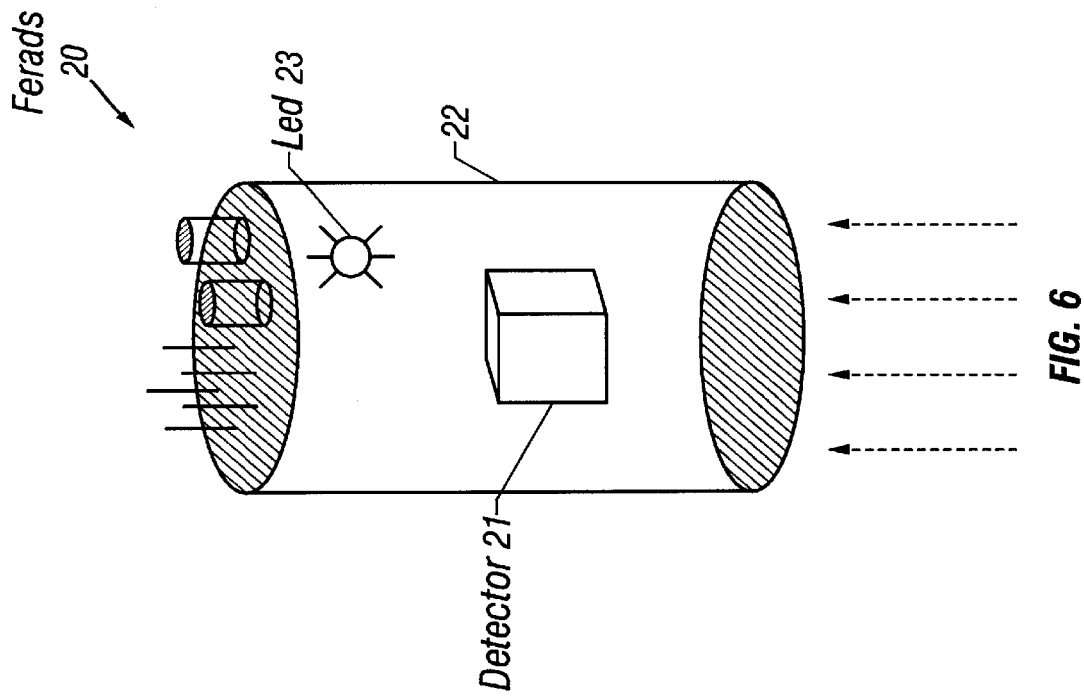
FIG. 6 illustrates an embodiment of an improved semiconductor radiation spectrometer based on optical field engineering.

FIG. 6 illustrates an embodiment of an improved radiation spectrometer (FERADS) indicated generally at 20, based on optical engineer in accordance with the present invention, and along with an LED of the special selected photon energy tunable for use in the optical engineering of the internal electric field and optimization of the detector performance. The detector 21 is voltage biased as described above. This kind of semiconductor radiation detector is portable, small size and operates at room temperature. Many smaller detectors could be stacked, vertically and horizontally, with the same box to further increase the overall detector efficiency.

As pointed out above, compared with the complex, destructive and expensive hardware modifications, this optical method provides a simple, nondestructive, contactless, and less costly approach to produce improved semiconductor radiation detectors. The improved detector performance is accomplished through optical engineering of the internal electric field distributions. This innovative technique for producing low cost, high resolution, and high efficiency semiconductor radiation detectors will find wide use, such as for CdZnTe x-ray and gamma-ray spectrometers for medical imaging, environmental monitoring, nuclear materials detection, unexploded ordnance or central-band drug detection, forensic analyses, etc.

It has thus been shown that the present invention provides a significant advance in the field of semiconductor radiation detection by providing optical engineering of the internal electric field distribution of the detector. The method of this invention enables optimization of the detector in addition to miniaturization and low fabrication costs.

While a particular embodiment of the invention has been illustrated and described, along with specific materials, parameters, etc., such are not intended to be limiting. Modifications and changes may become apparent to those skilled in the art, and it is intended that the invention be limited only by the scope of the appended claims.

What is claimed is:

1. A method for engineering the internal electric field distribution of a semiconductor radiation detector, comprising:
   providing a bias voltage across the semiconductor radiation detector;
   illuminating the semiconductor radiation detector with an optical beam having a selected photon energy; and
   producing different internal electric field distributions of the semiconductor radiation detector by utilizing different light beam intensities or photon energies.

2. The method of claim 1, additionally including providing a planar semiconductor detector.

3. The method of claim 1, additionally including providing a planar semiconductor radiation detector having a single, pixellated, or strip electrode, or combinations of electrode geometries.

4. The method of claim 2, wherein the planar semiconductor radiation detector is composed of $Cd_{1-x}Zn_x Te$ where the Zn composition is between 0 and 0.4.

5. The method of claim 2, wherein the planar semiconductor radiation detector is composed of CdZnTe.

6. In a semiconductor radiation detector, the improvement comprising an optical light beam with a selected photon energy to illuminate said radiation detector said radiation detector having a voltage bias applied thereto to provide an internal electric field, said optical light beam photon energy for engineering the distribution of said internal electric field of the radiation detector.

7. The improvement of claimed 6, wherein the engineering is carried out using different light beam intensities.

8. The improvement of claim 6, wherein the engineering is carried out using different photon energies.

9. The improvement of claim 6, wherein the bias voltage is about 50–300 volts per mm of the detector width, and the photon energy is about the value of the semiconductor band gap.

10. The improvement of claim 9, wherein the bias voltage is about 1000 volts, and the photon energy is about 1.5–1.7 eV.

11. The improvement of claim 9, wherein the detector leakage current is about 5–7 times the detector dark current.

12. The improvement of claim 11, wherein the detector leakage current is about 35 nA to about 46 nA.

13. An improvement radiation detector comprising:
   a housing;
   a voltage biased planar semiconductor detector locating in said housing; and means located in said housing for optical engineering internal electric field distributions of the planar semiconductor detector.

14. The detector of claim 13, wherein said housing is cylindrical.

15. The detector of claim 13, wherein said planar semidconductor detector is composed of $Cd_{1-x}Zn_x$, Te where the Zn composition is between 0 to 0.4.

16. The detector of claim 13, wherein said planar semiconductor detector is composed of CdZnTe.

17. The detector of claim 13, wherein said means comprises an LED.

18. The detector of claim 17, wherein said LED is of a special selected photon energy tunable for use in optical engineering of the internal electric field of the planar semiconductor detector.

19. The detector of claim 13, wherein said means for optical engineering can be changed in intensity or in photon energy.

20. The detector of claim 13, wherein said means for optical engineering includes a light source having a photon energy within about ±0.2 eV of the planar semiconductor detector band gap.

21. The detector of claim 13, wherein said means for optical engineering includes an infrared light source.

22. The detector of claim 20, wherein said light source can be changed in intensity or photon energy, for producing different distributions of the internal electric field.

23. The detector of claim 13, wherein said means for optical engineering comprises an optical light beam with a selected photon energy.

* * * * *